(12) United States Patent
Hu et al.

(10) Patent No.: US 9,076,869 B1
(45) Date of Patent: Jul. 7, 2015

(54) FINFET DEVICE AND METHOD

(71) Applicant: Taiwan Semiconductor Manufacturing Company, Ltd., Hsin-Chu (TW)

(72) Inventors: Chia-Hsin Hu, Changhua (TW); Sun-Jay Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/150,588

(22) Filed: Jan. 8, 2014

(51) Int. Cl.
*H01L 21/8238* (2006.01)
*H01L 29/78* (2006.01)
*H01L 29/66* (2006.01)
*H01L 29/36* (2006.01)

(52) U.S. Cl.
CPC ........ *H01L 29/7848* (2013.01); *H01L 29/6681* (2013.01); *H01L 29/36* (2013.01); *H01L 29/7851* (2013.01)

(58) Field of Classification Search
CPC ............ H01L 27/0886; H01L 27/0924; H01L 27/10826; H01L 27/10879; H01L 27/1211; H01L 29/785; H01L 29/41791; H01L 29/66795; H01L 21/823431; H01L 21/823521; H01L 21/845
See application file for complete search history.

(56) References Cited

U.S. PATENT DOCUMENTS

| 2011/0049613 | A1 | 3/2011 | Yeh et al. |
| 2013/0235652 | A1 | 9/2013 | Liaw |
| 2014/0061814 | A1* | 3/2014 | Kim et al. ............ 257/369 |

FOREIGN PATENT DOCUMENTS

| KR | 100725951 | 5/2007 |
| KR | 20110025075 A | 3/2011 |
| KR | 20130102450 A | 9/2013 |

* cited by examiner

*Primary Examiner* — Hoai V Pham
(74) *Attorney, Agent, or Firm* — Slater & Matsil, L.L.P.

(57) ABSTRACT

A fin field effect transistor (FinFET), and a method of fabrication, is introduced. In an embodiment, trenches are formed in a substrate, wherein a region between adjacent trenches defines a fin. A dielectric material is formed in the trenches. A part of the substrate is doped and a region of high dopant concentration and a region of low dopant concentration are formed. Gate stacks are formed, portions of the fins are removed and source/drain regions are epitaxially grown in the regions of high/low dopant concentration. Contacts are formed to provide electrical contacts to source/gate/drain regions.

20 Claims, 7 Drawing Sheets

FINFET DEVICE AND METHOD

BACKGROUND

Semiconductor manufacturers face a constant challenge to comply with Moore's Law. They constantly strive to continually decrease feature sizes, such as active and passive devices, interconnecting wire widths and thicknesses and power consumption as well as increase device density, wire density and operating frequencies.

As the semiconductor devices are getting smaller, they show degradation in performance. For example, planar metal-oxide-semiconductor field effect (MOSFET) transistor gates do not have abilities to adequately control channels. In addition, reduction in size leads to lower currents in the channels, leakage currents, and short channel effects to name a few.

The semiconductor industry came up with a solution to move away from the planar structures and introduce three dimensional (3D) features. For example, channels have a form of a 3D bar or a similar 3D structure, which is usually referred as a "fin" in the so called FinFET transistors. The 3D channel can be controlled from more than one side, which leads to an improvement in device functionality. Moreover, the FinFET transistors have higher drain currents, have higher switching speeds, lower switching voltages, less leakage currents, and consume less power.

In addition to the above discussed challenges, the semiconductor manufacturers have to deal with more specific ones that are pertinent to particular device functionalities. For example, high-voltage MOSFETs, which can be used in switches or in other high-power applications, need to be designed to have high breakdown voltages. The voltage breakdown is usually caused by the Zener or the avalanche effects and is highly dependent on a particular device implementation.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

The present disclosure is presented in terms of forming a fin field effect transistor (FinFET) with high breakdown voltage characteristics. As will be described in detail below, a substrate and fins are inhomogeneously doped to form regions of high and low dopant concentrations. Sources and drains are subsequently formed in the region of high dopant concentration and the region of low dopant concentration, respectively. By suitably adjusting device parameters, performance enhancements are achieved, such as increase of a breakdown voltage while maintaining a high drain current.

Figure 1:
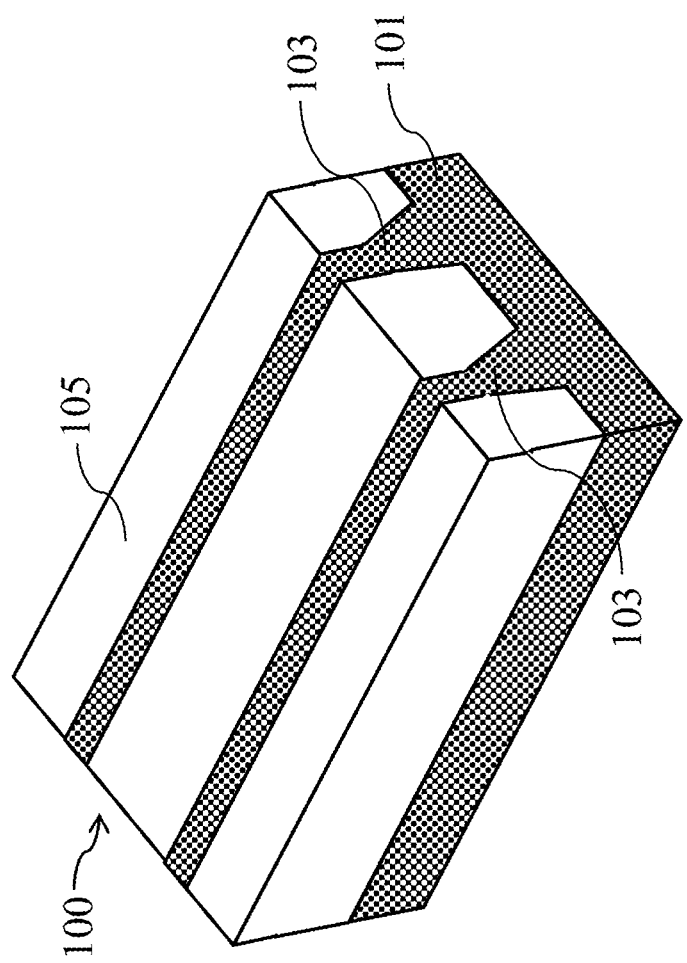
FIGS. 1-5 are three-dimensional views illustrating a semiconductor device fabrication process in accordance with an embodiment.

FIGS. 1-5 illustrate various intermediate stages of a method of forming a semiconductor device 100 in accordance with an embodiment. Referring first to FIG. 1, there is shown a substrate 101 having fins 103 extending therefrom, and a shallow trench isolation (STI) layer 105 on top of the substrate 101 between the fins 103. In some embodiments, the substrate 101 comprises a crystalline silicon substrate (e.g., wafer), doped or undoped. In other embodiments, the substrate 101 may be made of some other suitable semiconductors, such as gallium arsenide, silicon carbide, indium arsenide, indium phosphide, silicon germanium carbide, gallium arsenic phosphide, or gallium indium phosphide. Further, the substrate 101 may include a strained epitaxial layer (EPI-layer) for performance enhancement. For example, in some embodiments all or a portion of the fins 103 may be replaced with an epitaxial material having a different lattice structure than the substrate 101 such that a stress may be applied to a channel region for improved performance. In yet other embodiments, the substrate 101 may be a silicon-on-insulator (SOI) structure.

In an embodiment, the substrate 101 may comprise a p-doped silicon, doped using, for example, boron or other suitable acceptor dopants to form a body of an NMOS FinFET device. In an embodiment, the substrate 101 has a dopant concentration of between about $1E15$ cm$^{-3}$ and about $1E17$ cm$^{-3}$. This disclosure is presented in terms of forming an NMOS device. In other embodiments, dopants may be selected to form a PMOS device.

The substrate 101 may be patterned to form the fins 103 using, for example, photolithography techniques. Generally, a photoresist material (not shown) is deposited, irradiated (exposed), and developed to remove a portion of the photoresist material. The remaining photoresist material protects the underlying material from subsequent processing steps, such as etching. In this example, the photoresist material is used to form a patterned mask (not shown) to protect sections of the substrate 101 while etching trenches in the substrate, thereby defining the fins 103. Subsequently, the photoresist material is removed using, for example, an ashing process in combination with a wet clean process.

In some embodiments, it may be desirable to use an additional mask layer. During the etching process to pattern the substrate 101, portions of the patterned photoresist material may also be removed. In some instances, the entire photoresist material may be removed prior to the completion of the etching process to from the fins 103. In these situations, the additional mask, such as a hard mask, may be used. For example, a hard mask layer (not shown) may comprise an oxide layer (not shown) and an overlying nitride layer (not shown), and may be formed over the substrate 101 to further aid in the patterning process of the substrate 101. The oxide layer may be a thin film comprising silicon oxide formed, for example, using a thermal oxidation process. In an embodiment, the nitride layer is formed of silicon nitride, for example, using low-pressure chemical vapor deposition (LPCVD), plasma enhanced chemical vapor deposition (PECVD), or similar.

The substrate 101 is etched to remove exposed portions of the substrate 101 to form trenches in the substrate 101, wherein portions of the substrate 101 between adjacent trenches form the fins 103. The substrate 101 is etched, for example, by an anisotropic wet etch process or an anisotropic dry etch process. In an embodiment, the anisotropic wet etch may be performed on the substrate 101 comprising silicon using potassium hydroxide (KOH), ethylenediamine pyrocatechol (EDP), tetramethylammonium hydroxide (TMAH), or similar. The anisotropic dry etch process may include physical dry etching, chemical dry etching, reactive ion etching, or similar. In an embodiment, the ions that are used in chemical dry etching of silicon are tetrafluoromethane ($CF_4$), sulfur hexafluoride ($SF_6$), nitrogen trifluoride ($NF_3$), chlorine gas ($Cl_2$), or fluorine ($F_2$). The typical reactive ion etching gasses for silicon are $CF_4$, $SF_6$ and $BCl_2+Cl_2$. In some embodiments, when viewed from above, the trenches may be strips parallel to each other, and closely spaced with respect to each other. In some embodiments, the trenches may be continuous and surrounding the fins 103. In other embodiments, the fins 103 may be formed using a suitable multiple patterning method such as, for example, the sidewall image transfer (SIT) process. In an embodiment, the fins 103 may have a height of between about 20 nm to about 50 nm.

In some embodiments, the trenches between the adjacent fins 103 in the substrate 101 are filled with a dielectric material to form the STI layer 105. The STI layer 105 may comprise silicon oxide, silicon nitride, fluoride-doped silicate glass (FSG), or a low-K dielectric material, may also be used. In some embodiments, the STI layer 105 may be formed using a high-density-plasma (HDP) CVD process, using silane ($SiH_4$) and oxygen ($O_2$) as reacting precursors. In other embodiments, the STI layer 105 may be formed using a sub-atmospheric CVD (SACVD) process or high aspect-ratio process (HARP), wherein process gases may comprise tetraethylorthosilicate (TEOS) and ozone ($O_3$). In yet other embodiments, the STI layer 105 may be formed using a spin-on-dielectric (SOD) process, such as hydrogen silsesquioxane (HSQ) or methyl silsesquioxane (MSQ). Other processes and materials may be used. A chemical mechanical planarization (CMP) may be performed to remove excess portion of the dielectric material forming the STI layer 105 as illustrated in FIG. 1. The hard mask layer may act as a planarization stop layer during the CMP process.

In reference to FIG. 2, a patterned mask layer 201 is subsequently used to aid in further doping portions of the substrate 101 and the fins 103. The patterned mask layer 201 protects a region of the substrate 101 and the fins 103 from additional doping. An unprotected region 203 of the substrate 101 and the fins 103 may be doped to achieve a doping level and/or a profile that is different from a protected region 205 of the substrate 101 and the fins 103. Hence, a non-uniform doping profile may be formed in the substrate 101 and the fins 103. As will be discussed in greater detail below, a high voltage transistor will be formed such that one of the source/drain regions will be formed in the unprotected region 203 of the substrate 101, while the other of the source/drain regions will be formed in the protected region 205 of the substrate 101. For example, as described below the source region is formed in the unprotected region 203, which will be doped to a greater degree, and the drain region is formed in the protected region 205, which will be doped to a lesser degree. The specific pattern of the patterned mask layer 201, as described herein, is for illustrative purposes only, and other patterns may be formed depending on the design of the semiconductor device 100. In an embodiment, a photoresist layer is deposited, irradiated (exposed), and developed to remove a portion of the photoresist material and is subsequently used as the patterned mask layer 201.

Figure 2:
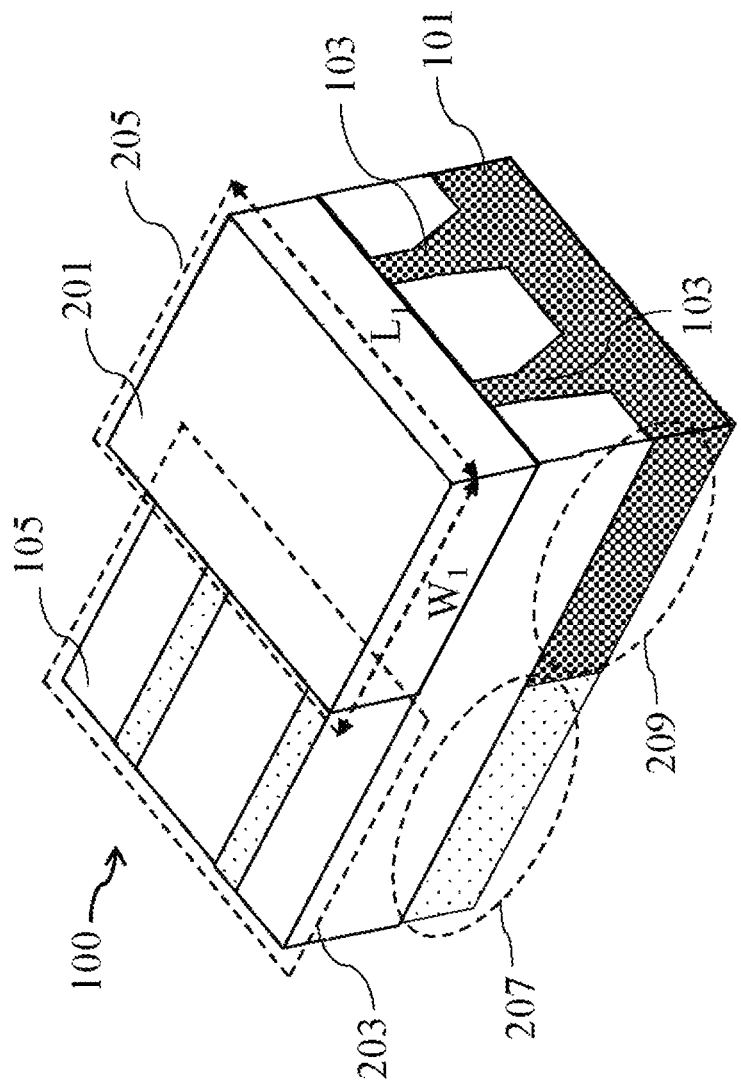

In an embodiment, the protected region 205 has a first width $W_1$ and a first length $L_1$ (as viewed from above), as illustrated in FIG. 2. The first width $W_1$ is between about 0.2 μm and about 5 μm, and the first length $L_1$ is between about 0.05 μm and about 100 μm. Dimensions of the protected region 205 can be altered to fine tune the performance of the semiconductor device 100, as will be described below in reference to FIG. 6.

In an embodiment, the substrate 101 may comprise a p-doped silicon, which is further doped in the unprotected region 203, thereby forming a $p^+$-well 207 in the unprotected region 203 of the substrate 101 and a $p^-$-well 209 in the protected region 205 of the substrate 101. The dopant concentration of the $p^+$-well 207 is different from the dopant concentration of the substrate 101 and the $p^-$-well 209, and the dopant concentration of the $p^-$-well 209 may be between about 1% and about 50% of the dopant concentration of the $p^+$-well 207. In an embodiment, the $p^+$-well 207 has the dopant concentration of between about $1E17\ cm^{-3}$ and about $5E18\ cm^{-3}$, and the $p^-$-well 209 has the dopant concentration of between about $1E15\ cm^{-3}$ and about $2.5E18\ cm^{-3}$.

In another embodiment, the $p^+$-well 207 may be formed prior to forming the trenches and fins 103. For example, the substrate 101 may be masked and an implant process, such as that discussed above, may be performed to create the $p^+$-well 207. Once the $p^+$-well 207 is formed, the substrate 101 may be masked and patterned to form the trenches and the STI layer 105 may be formed.

Figure 3:
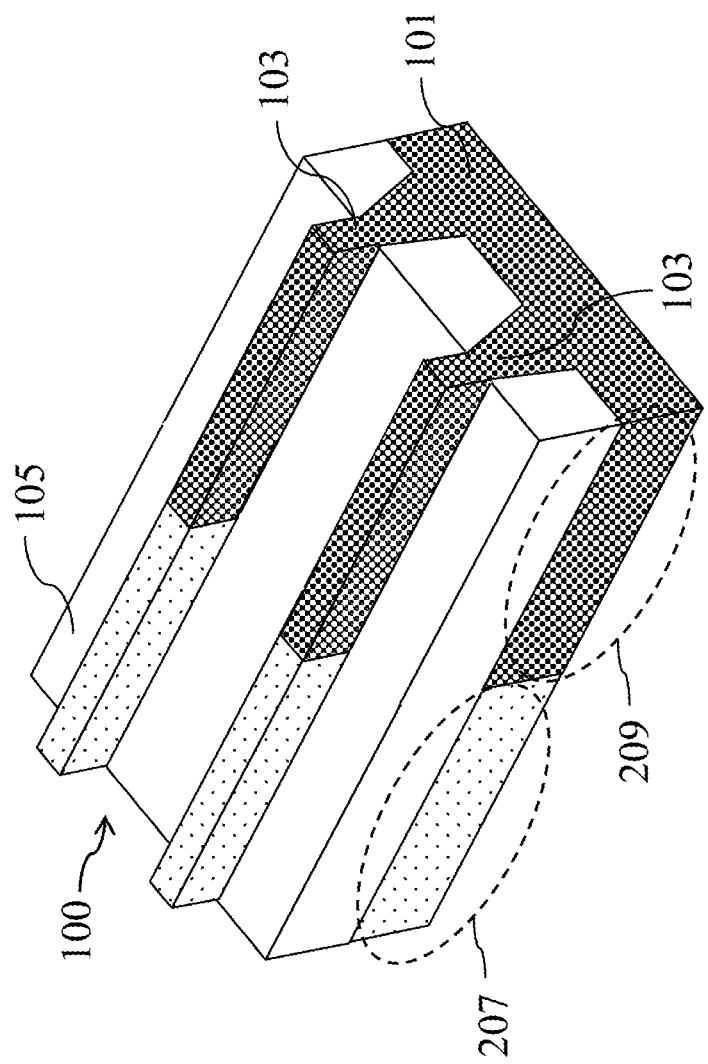
Figure 4:
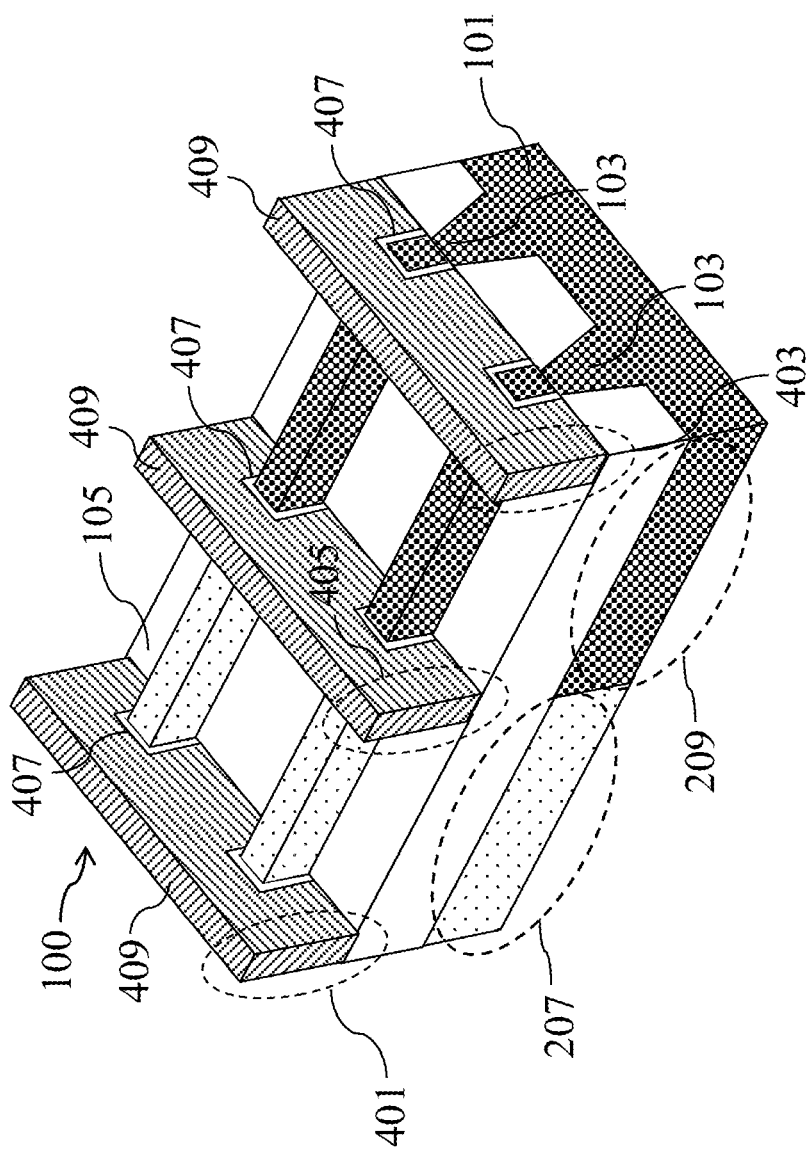

Referring now to FIG. 3, the STI layer 105 is recessed, for example, by a selective wet etch or a selective dry etch process to expose portions of the fins 103. In an embodiment, the hard mask layer (not shown) may be used to aid in etching of the STI layer 105 to expose the fins 103. The STI layer 105 may be etched, for example, by anisotropic dry etch processes or an anisotropic wet etch processes discussed above to remove exposed portions the STI layer 105. For example, the STI layer 105 may be recessed using a reactive ion etching process with tetrafluoromethane ($CF_4$) gas. In another embodiment, the STI layer 105 may be recessed by blanket etch process using HF, or the like FIG. 4 illustrates a gate structure comprising a first dummy gate stack 401, a second dummy gate stack 403 and a gate stack 405 formed over the fins 103. For example, the gate stacks may be formed by depositing a gate dielectric layer and a gate conductive layer over the fins 103 by CVD, physical vapor deposition (PVD), atomic layer deposition (ALD), other suitable methods, and/or combinations thereof. A photolithography patterning process, including depositing a photoresist material, exposing according to a desired pattern, and developing, is used to pattern the gate dielectric layer and the gate conductive layer to form a gate dielectric 407 and a gate electrode 409 of the first dummy gate stack 401, the second dummy gate stack 403, and the gate stack 405, as illustrated in FIG. 4. The etching processes may include, for example, dry etching, wet etching, and/or other etching methods (e.g., reactive ion etching). The gate dielectric layer may include any suitable material, such as silicon oxide, silicon nitride, or a high-k dielectric material. The gate conductive layer may include highly doped polysilicon, a metallic material, or any suitable conductive material. In an embodiment, the gate dielectric 407 may have a thickness of between about 0.8 nm and about 1.5 nm, and the gate electrode 409 may have a thickness of between about 20 nm and about 45 nm.

Figure 5:
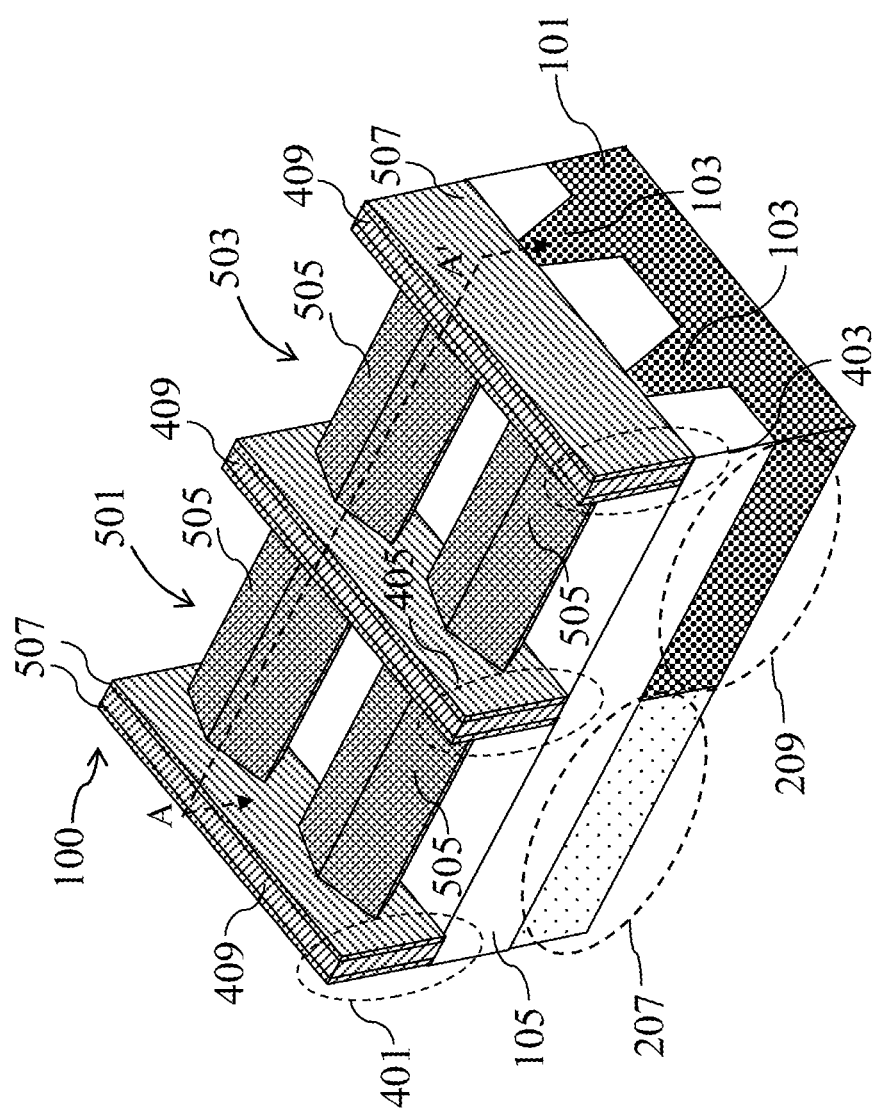

FIG. 5 illustrates formation of spacers 507 which may be formed alongside the first dummy gate stack 401, the second dummy gate stack 403, and the gate stack 405. The spacers 507 may include one or more layers of a dielectric material such as silicon oxide, silicon nitride, silicon carbide, silicon oxynitride, or combinations thereof. The spacers 507 may be formed by, for example, depositing a dielectric material over the gate structure and anisotropically etching the dielectric material.

FIG. 5 further illustrates formation of an optional stress-inducing material 505 in source regions 501 and drain regions 503 along opposing sides of the gate stack 405. Generally, an epitaxial material having a different lattice constant may be formed over the fins 103 or may replace a portion of the fins 103. The different lattice constants of the materials of the substrate 101 and the epitaxial material may induce a strain within the channel region, thereby increasing device performance. For example, in embodiments in which the substrate 101 is silicon, the epitaxial material may be Ge, SiC, GaAs, AlGaAs, SiGe, GaAsP, or other suitable material. In another example, the epitaxial material may be SiC to induce a stress in the channel and enhance performance of the NMOS FinFET device, and the epitaxial material may be SiGe to induce a stress in the channel and enhance performance of a PMOS FinFET device. In yet other embodiments, multiple epitaxial layers may be used.

In an embodiment, portions of the fins 103 are removed and replaced with the stress-inducing material 505. For example, the STI layer 105 may act as a hard mask for a selective etch process to recess exposed portions of the fins 103. In some embodiments, the etching process may be performed using a chemical selected from $Cl_2$, HBr, $NF_3$, $CF_4$, and $SF_6$ as an etching gas. In some embodiments, the fins 103 in the source region 501 and the drain region 503 are recessed to a depth of about 30 nm to about 60 nm below an upper surface of the fins 103 in the channel region. In some embodiments, portions of the STI layer 105 may also be recessed to form, for example, a common source/drain trench. A suitable semiconductor material is epitaxially grown in recesses to form the source regions 501 and the drain regions 503 as illustrated in FIG. 5.

The source regions 501 and the drain regions 503 may be in-situ doped during the epitaxial process and/or one or more subsequent doping process, e.g., an implant, may be performed. For example, epitaxially grown silicon source/drain regions may be doped with n-type dopants, e.g., phosphorous or the like, to form an NMOS device, or p-type dopants, e.g., boron or the like, to form a PMOS device. Multiple doping processes may be utilized to create a desired doping profile, including, for example, lightly-doped drain (LDD) regions and the like. In an embodiment, the source regions 501 and the drain regions 503 may have a dopant concentration of between about 5E18 $cm^{-3}$ and about 1E20 $cm^{-3}$.

Further manufacturing steps may be performed on the semiconductor device 100. For example, an interlayer dielectric (ILD) layer (discussed below in reference to FIG. 6) may be deposited over the source regions 501, the drain regions 503, the first dummy gate stack 401, the second dummy gate stack 403, and the gate stack 405. The ILD layer may be formed by a suitable technique, such as CVD, ALD, and spin-on (SOG). Subsequently, contacts (discussed below in reference to FIG. 6) are formed to provide electrical contacts to the source regions 501, the drain regions 503, and the gate stack 405. The contacts may be formed by suitable methods, such as various deposition methods, damascene method, dual damascene method, or similar.

Figure 6:
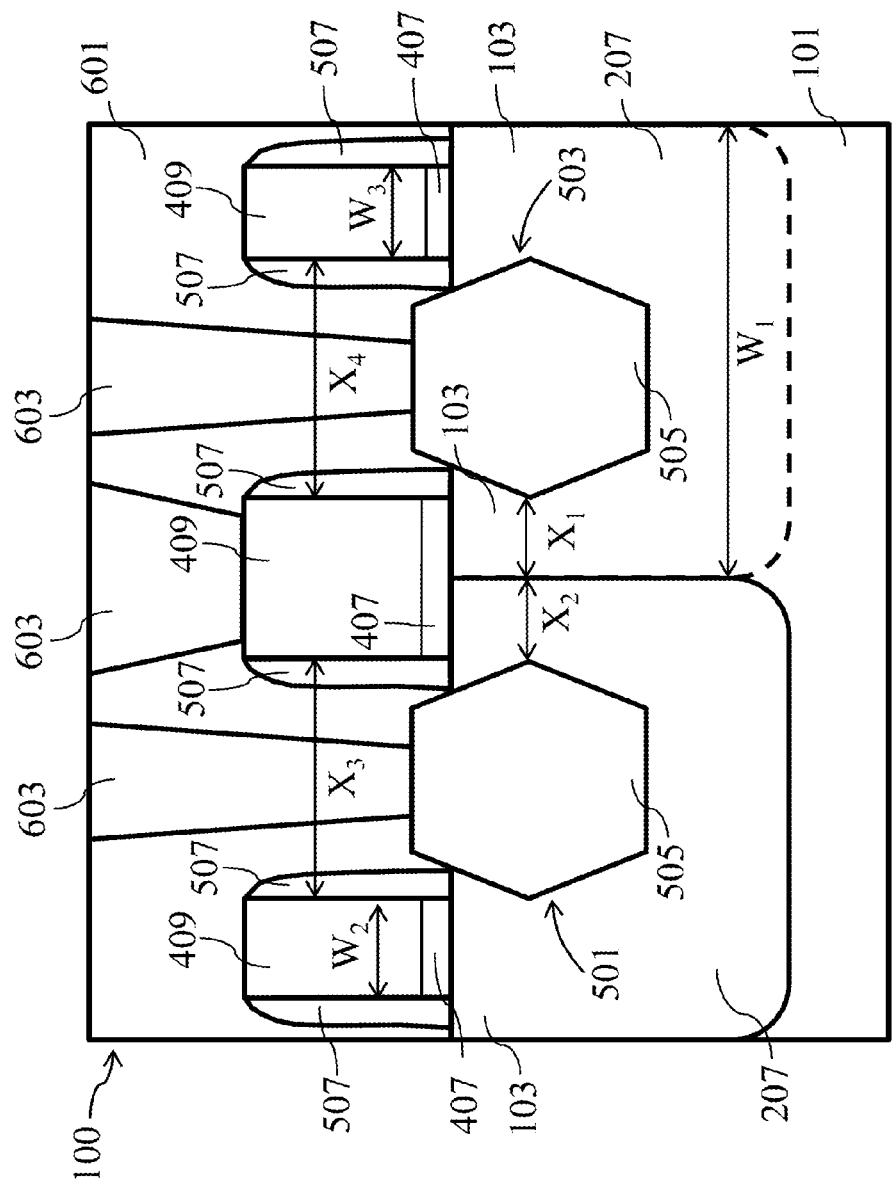
FIG. 6 is a cross-sectional view illustrating a semiconductor device structure in accordance with an embodiment.

FIG. 6 illustrates a cross-sectional view of the semiconductor device 100 shown in the FIG. 5 along a line A-A' after the ILD layer and the contacts are formed. The ILD layer 601 is formed of one or more layers of dielectric material, such as silicon oxide, oxynitride, low-k dielectrics or other suitable materials, by a suitable technique, such as CVD, ALD, and spin-on (SOG). A CMP process may be performed to remove excessive dielectric material from the ILD layer 601.

The contacts 603 are formed in the ILD layer 601 to provide electrical contacts to the source regions 501, the drain regions 503, and the gate stack 405. The ILD layer 601 may be patterned using photolithography techniques to form trenches and vias. The contacts 603 are formed by depositing a suitable material in the trenches and the vias of the ILD layer 601 using various deposition and plating methods, or similar. In addition, the contacts 603 may include one or more barrier/adhesion layers (not shown) to protect the ILD layer 601 from diffusion and metallic poisoning. The barrier layer may comprise titanium, titanium nitride, tantalum, tantalum nitride, or other alternatives. The barrier layer may be formed using PVD, CVD, or the like.

The material of the contacts 603 may comprise copper, a copper alloy, silver, gold, tungsten, tantalum, aluminum, and the like. In an embodiment, the steps for forming the barrier layer and the contacts 603 may include blanket forming barrier layer, depositing a thin seed layer of a conductive material, and filling the trenches and the vias in the ILD layer 601 with the conductive material, for example, by plating. A CMP is then performed to remove excess barrier layer and the conductive material.

In reference to FIG. 6, various dimensions and relative distances are illustrated that may be adjusted to achieve a desired device specification. A first distance $X_1$ extends from a left edge of the stress-inducing material 505 to a right edge of the $p^+$-well 207, and a second distance $X_2$ extends from the right edge of the $p^+$-well 207 to a right edge of the stress-inducing material 505. In an embodiment, the ratio of the first distance $X_1$ and the second distance $X_2$ is between about 0.1 and about 10. A channel length between the source regions 501 and the drain regions is determined by adding the first distance $X_1$ and the second distance $X_2$, and is between about 0.01 μm and about 1 μm.

The first dummy gate stack 401 has a second width $W_2$ of between about 0.01 μm and about 1 μm, and the second dummy gate stack 403 has a third width $W_3$ of between about 0.01 μm and about 1 μm. In an embodiment, the second width $W_2$ and the third width $W_3$ may equal to each other. In another embodiment, the second width $W_2$ and the third width $W_3$ may be different from each other. A third distance $X_3$ between a right edge of the first dummy gate stack 401 and a left edge of the gate stack 405 is between about 0.05 μm and about 0.5 μm. A fourth distance $X_4$ between a right edge of the gate stack 405 and a left edge of the second dummy gate stack 403 is between about 0.05 μm and about 0.5 μm. In an embodiment, the third distance $X_3$ and the fourth distance $X_4$ may equal to each other. In another embodiment, the third distance $X_3$ and the fourth distance $X_4$ may be different from each other.

These widths and relative distances may be adjusted for a particular design or application. For example, in an embodiment with the first distance $X_1$ greater than the second distance $X_2$, the semiconductor device 100 may display high breakdown voltage characteristics, while having low drain current characteristics. In another embodiment with the first distance $X_1$ less than the second distance $X_2$, the semiconductor device 100 may display low breakdown voltage characteristics, while having high drain current characteristics. The first distance $X_1$ and the second distance $X_2$ can be chosen according to design specifications of the semiconductor device 100 to achieve the desired voltage and current performance. The second width $W_2$ and the third width $W_3$ can be also changed to control dimensions of the source regions 501 and the drain regions 503.

FIG. 6 further illustrates that the source regions 501 have the p$^+$-well 207 directly below, while the drain regions 503 have the p$^-$-well 209, e.g., the lightly doped substrate, directly below. The semiconductor device 100 with a drain PN junction comprising the drain regions 503 and the p$^-$-well 209 shows a higher breakdown voltage $V_{BR}$, compared to a case when the drain PN junction consists of the drain regions 503 and the p$^+$-well 207. In an embodiment, the breakdown voltage $V_{BR}$ of the semiconductor device 100 is between about 8V and about 15V.

Figure 7:
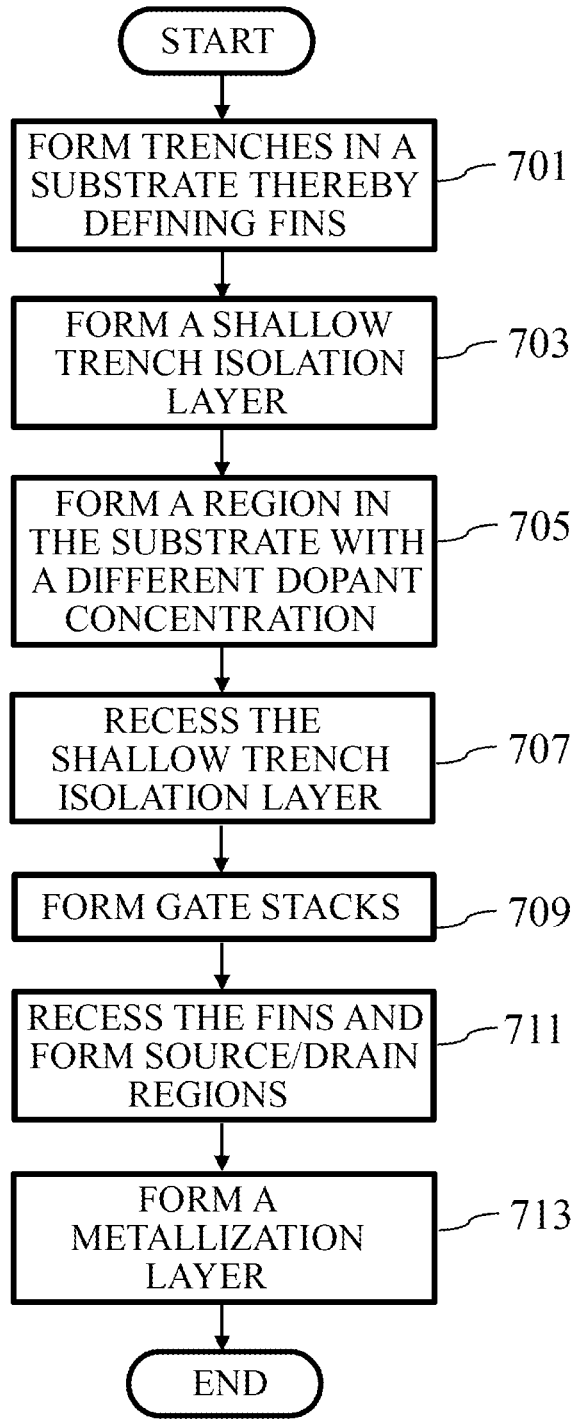
FIG. 7 is a flowchart illustrating a semiconductor device fabrication method in accordance with an embodiment.

FIG. 7 is a flowchart illustrating a method that may be performed to manufacture a semiconductor device in accordance with an embodiment. The method begins at step 701, wherein trenches are formed in a substrate, such as that discussed above with reference to FIG. 1. Adjacent trenches define a fin interposed between the trenches. In step 703, a shallow trench isolation layer is formed over the substrate and between the fins by depositing a dielectric material in the trenches and performing a chemical mechanical planarization to remove excess dielectric material. After forming the shallow trench isolation layer, a region of the substrate and the fins are doped in step 705, as discussed above with reference to FIG. 2.

The shallow trench isolation layer is recessed and portion of the fins are exposed in step 707 as discussed above with reference to FIG. 3. Thereafter, in step 709, gate stacks are formed, such as that discussed above with reference to FIG. 4. The fins are recessed in step 711 and source/drain regions are epitaxially grown in openings of the fins, such as that discussed above with reference to FIG. 5. Finally, in the step 713 a metallization layer is formed, such as that discussed above with reference to FIG. 6. The metallization layer may comprise an interlayer dielectric layer, with contacts embedded in the interlayer dielectric layer to provide electrical contacts to source/gate/drain regions.

A method of fabrication an NMOS FinFET device has been described above in reference to FIGS. 1-7 for purposes of illustration. However, it will be apparent to persons skilled in the art that similar fabrication method may be used to form a PMOS FinFET device.

In an embodiment, a semiconductor device comprises a substrate having a plurality of fins extending therefrom, a first well of a first conductivity type in the substrate, a second well of the first conductivity type in the substrate, the first well having a higher dopant concentration than the second well. The semiconductor device further comprises a gate stack overlaying a junction between the first well and the second well, a source region of a second conductivity type in the first well, and a drain region of the second conductivity type in the second well.

In an embodiment, a semiconductor device comprises a substrate having a plurality of trenches and fins interposed between adjacent trenches, the substrate being lightly doped with a first conductivity type. The semiconductor device further comprises a first region in the substrate, the first region being doped with the first conductivity type, the first region having a higher dopant concentration than a dopant concentration of the substrate and a second region in the substrate, the second region having the dopant concentration of the substrate. The semiconductor device further comprises a first source/drain region of a second conductivity type in the first region, and a second source/drain region of the second conductivity type in the second region.

In an embodiment, a method of fabricating a semiconductor device comprises providing a substrate, the substrate having a first dopant concentration of a first conductivity type in a first region and a second dopant concentration of the first conductivity type in a second region, the first dopant concentration being greater than the second dopant concentration, the substrate having one or more fins extending therefrom, the one or more fins extending through the first region and the second region. The method further comprises forming a gate stack over the one or more fins, the gate stack overlapping a junction of the first region and the second region, and forming source/drain regions on opposing sides of the gate stack such that a first source/drain region is in the first region and a second source/drain region is in the second region.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of fabricating a semiconductor device, the method comprising:
   providing a substrate, the substrate having a first dopant concentration of a first conductivity type in a first region and a second dopant concentration of the first conductivity type in a second region, the first dopant concentration being greater than the second dopant concentration, the substrate having one or more fins extending therefrom, the one or more fins extending through the first region and the second region;
   forming a gate stack over the one or more fins, the gate stack overlapping a junction of the first region and the second region; and
   forming source/drain regions on opposing sides of the gate stack such that a first source/drain region is in the first region and a second source/drain region is in the second region.

2. The method of claim 1, further comprising:
   recessing a portion of the fins in the first region and the second region; and
   epitaxially growing a semiconductor material over recessed portions of the fins.

3. The method of claim 1, further comprising forming a first dummy gate in the first region and a second dummy gate in the second region.

4. The method of claim 1, further comprising forming contacts to provide electrical contacts to the sources, the drains, and the gate.

5. The method of claim 1, wherein the first dopant concentration is between about 1E17 cm$^{-3}$ and about 5E18 cm$^{-3}$.

6. The method of claim 1, wherein the second dopant concentration is between about 1% and about 50% of the first dopant concentration.

7. A method of fabricating a semiconductor device, the method comprising:
   patterning a substrate to form a plurality of trenches, the substrate having a first dopant concentration of a first conductivity type, portions of the substrate between neighboring trenches forming fins;
   masking the substrate, a protected region of the substrate forming a first well in the substrate;
   doping an unprotected region of the substrate to form a second well in the substrate, the second well having a second dopant concentration of the first conductivity type, the second dopant concentration being greater than the first dopant concentration;

forming a gate stack over the fins, the gate stack extending across a junction between the first well and the second well; and replacing portions of the fins on opposing sides of the gate stack with a semiconductor material to form source/drain regions, a first source/drain region being disposed in the first well and a second source/drain region being disposed in the second well.

8. The method of claim 7, wherein replacing the portion of the fins comprises:

recessing the portions of the fins; and epitaxially growing the semiconductor material over recessed portions of the fins.

9. The method of claim 8, wherein the semiconductor material is a stress-inducing material.

10. The method of claim 7, further comprising forming a first dummy gate stack in the first region and a second dummy gate stack in the second region.

11. The method of claim 10, wherein the first source/drain region is interposed between the first dummy gate stack and the gate stack and the second source/drain region is interposed between the second dummy gate stack and the gate stack.

12. The method of claim 7, wherein a distance between the first source/drain region and the junction between the first well and the second well is larger than a distance between the second source/drain region and the junction between the first well and the second well.

13. The method of claim 7, wherein a distance between the first source/drain region and the junction between the first well and the second well is smaller than a distance between the second source/drain region and the junction between the first well and the second well.

14. A method of fabricating a semiconductor device, the method comprising:

forming trenches in a substrate, the substrate having a first dopant concentration of a first conductivity type;

forming shallow trench isolation (STI) regions in the trenches, a topmost surface of the substrate being substantially coplanar with topmost surfaces of the STI regions;

forming a mask over the substrate;

doping a region of the substrate exposed by the mask to form a well in the substrate, the well having a second dopant concentration of the first conductivity type, the second dopant concentration being greater than the first dopant concentration;

recessing the STI regions to expose fins;

forming a gate stack over the fins;

forming spacers on sidewalls of the gate stack, a first spacer being disposed over the well and a second spacer being disposed over a portion of the substrate having the first dopant concentration; and forming source/drain regions in the fins, the first spacer being interposed between a first source/drain region and the gate stack and the second spacer being interposed between a second source/drain region and the gate stack.

15. The method of claim 14, wherein forming the source/drain regions comprises:

recessing portions of the fins on opposing sides of the gate stack; and epitaxially growing a semiconductor material over recessed portions of the fins.

16. The method of claim 15, wherein the semiconductor material has a lattice constant different from the substrate.

17. The method of claim 14, further comprising forming a dummy gate stack over the fins, wherein the first source/drain region is interposed between the dummy gate stack and the gate stack.

18. The method of claim 14, wherein a distance between the first source/drain region and the second source/drain region is between about 0.01 µm and about 1 µm.

19. The method of claim 14, wherein the second dopant concentration is between about $1E17$ cm$^{-3}$ and about $5E18$ cm$^{-3}$.

20. The method of claim 14, wherein the first dopant concentration is between about 1% and about 50% of the second dopant concentration.

* * * * *